(12) United States Patent
Hshieh et al.

(10) Patent No.: US 6,762,098 B2
(45) Date of Patent: Jul. 13, 2004

(54) TRENCH DMOS TRANSISTOR WITH EMBEDDED TRENCH SCHOTTKY RECTIFIER

(75) Inventors: Fwu-Iuan Hshieh, Saratoga, CA (US); Yan Man Tsui, Union City, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/448,791

(22) Filed: May 30, 2003

(65) Prior Publication Data

US 2003/0207538 A1 Nov. 6, 2003

Related U.S. Application Data

(62) Division of application No. 09/684,931, filed on Oct. 6, 2000, now Pat. No. 6,593,620.

(51) Int. Cl.[7] .......................................... H01L 21/336
(52) U.S. Cl. ........................ 438/269; 438/576; 257/335; 257/476
(58) Field of Search ................................ 257/335, 476; 438/269, 576

(56) References Cited

U.S. PATENT DOCUMENTS

| | | | |
|---|---|---|---|
| 4,811,065 A | 3/1989 | Cogan | 357/23.4 |
| 4,982,260 A | 1/1991 | Chang et al. | 257/656 |
| 5,072,266 A | 12/1991 | Bulucea et al. | 257/330 |
| 5,262,668 A | 11/1993 | Tu et al. | 257/475 |
| 5,365,102 A | 11/1994 | Mehrotra et al. | 257/475 |
| 5,532,179 A | 7/1996 | Chang et al. | 437/40 |
| 5,541,425 A | 7/1996 | Nishihara | 257/139 |
| 5,612,567 A | 3/1997 | Baliga | 257/475 |
| 5,614,751 A | 3/1997 | Yilmaz et al. | 257/341 |
| 5,688,725 A | 11/1997 | Darwish et al. | 438/270 |
| 5,866,931 A | 2/1999 | Bulucea et al. | 257/331 |
| 5,877,528 A | 3/1999 | So | 257/331 |
| 5,915,179 A | 6/1999 | Etou et al. | 438/268 |
| 6,031,265 A | 2/2000 | Hshieh | 257/334 |
| 6,204,097 B1 | 3/2001 | Shen et al. | 438/133 |
| 6,593,620 B1 * | 7/2003 | Hshieh et al. | 257/335 |

FOREIGN PATENT DOCUMENTS

| | | | |
|---|---|---|---|
| EP | 0899791 A2 | 3/1999 | H01L/29/78 |
| WO | WO 00/51167 | 8/2000 | |

* cited by examiner

Primary Examiner—Richard Elms
Assistant Examiner—Christian D. Wilson
(74) Attorney, Agent, or Firm—Mayer Fortkort & Williams, PC; David B. Bonham, Esq.; Karin L. Williams, Esq.

(57) ABSTRACT

An integrated circuit having a plurality of trench Schottky barrier rectifiers within one or more rectifier regions and a plurality of trench DMOS transistors within one or more transistor regions. The integrated circuit comprises: (a) a substrate of a first conductivity type; (b) an epitaxial layer of the first conductivity type over the substrate, wherein the epitaxial layer has a lower doping level than the substrate; (c) a plurality of body regions of a second conductivity type within the epitaxial layer in the transistor regions; (d) a plurality of trenches within the epitaxial layer in both the transistor regions and the rectifier regions;

(e) a first insulating layer that lines the trenches; (f) a polysilicon conductor within the trenches and overlying the first insulating layer; (g) a plurality of source regions of the first conductivity type within the body regions at a location adjacent to the trenches; (h) a second insulating layer over the doped polysilicon layer in the transistor regions; and (i) an electrode layer over both the transistor regions and the rectifier regions.

6 Claims, 11 Drawing Sheets

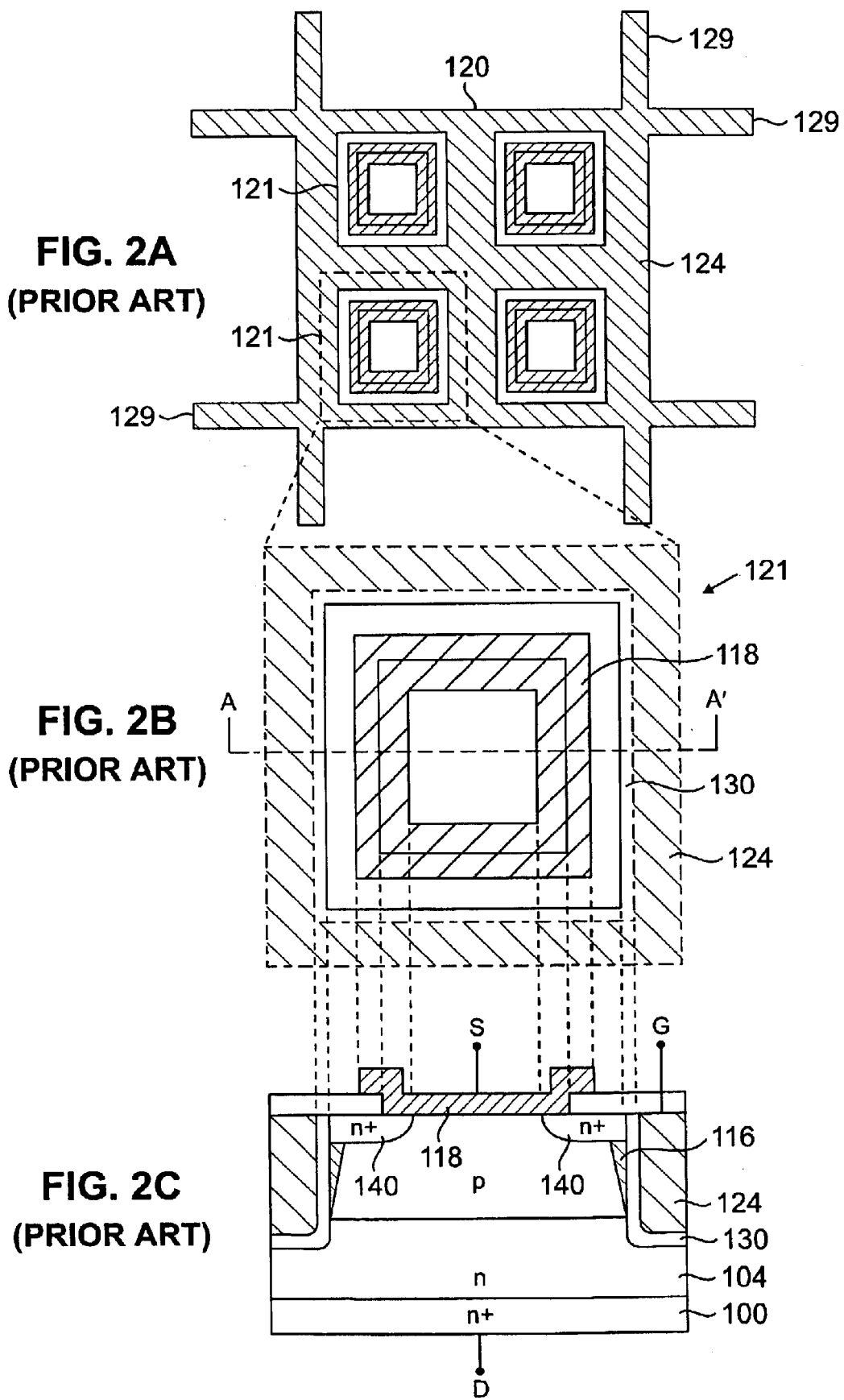

TRENCH DMOS TRANSISTOR WITH EMBEDDED TRENCH SCHOTTKY RECTIFIER

STATEMENT OF RELATED APPLICATIONS

This application is a division of U.S. patent application Ser. No. 09/684,931 entitled "Trench DMOS Transistor With Embedded Trench Schottky Rectifier" filed Oct. 6, 2000 now U.S. Pat. No. 6,593,620.

FIELD OF THE INVENTION

The present invention relates to integrated circuits comprising power MOSFETs in parallel with Schottky barrier rectifiers. More particularly, the present invention relates to the integration of trench DMOSFETs and trench Schottky rectifiers upon a single substrate.

BACKGROUND OF THE INVENTION

Schottky barrier rectifiers (also referred to as Schottky barrier diodes) have been used as synchronous rectifiers in DC—DC power converters. An improved version of a Schottky barrier rectifier is disclosed in U.S. Pat. No. 5,365,102 entitled "Schottky Barrier Rectifier with MOS Trench." A cross-sectional view of such a device is illustrated in FIG. 1. In this figure, rectifier 10 includes a semiconductor substrate 12 of first conductivity type, typically N-type conductivity, having a first face 12a and a second opposing face 12b. The substrate 12 comprises a relatively highly doped cathode region 12c (shown as N+) adjacent the first face 12a. A drift region 12d of first conductivity type (shown as N) extends from the cathode region 12c to the second face 12b. Hence, the doping concentration of the cathode region 12c is greater than that of the drift region 12d. A mesa 14 having a cross-sectional width "Wm", defined by opposing sides 14a and 14b, is formed in the drift region 12d. The mesa can be of stripe, rectangular, cylindrical or other similar geometry. Insulating regions 16a and 16b (e.g., $SiO_2$) are also provided on the mesa sides. The rectifier also includes an anode electrode 18 on the insulating regions 16a, 16b. The anode electrode 18 forms a Schottky rectifying contact with the mesa 14. The height of the Schottky barrier formed at the anode electrode/mesa interface is dependent not only on the type of electrode metal and semiconductor (e.g., Si, Ge, GaAs, and SiC) used, but is also dependent on the doping concentration in the mesa 14. A cathode electrode 20 is provided adjacent the cathode region 12c at the first face 12a. The cathode electrode 20 ohmically contacts cathode region 12c. Such a trench MOS Schottky barrier rectifier displays significant improvements in reverse blocking voltage. Typically, two or more individual trench MOS Schottky barrier rectifiers are fabricated in parallel, with rectifiers sharing common anode and cathode contacts. As a result, the individual trench MOS Schottky barrier rectifiers act as a single rectifier.

Unfortunately, Schottky barrier rectifiers, including those described in U.S. Pat. No. 5,365,102, have relatively high on-resistance (forward-biased voltage drop). Moreover, many Schottky barrier rectifiers have relatively high reverse-biased leakage currents. As a result, Schottky barrier rectifiers are frequently replaced for power conversion applications by power MOSFETs (Metal Oxide Semiconductor Field Effect Transistors), which address these problems.

DMOS transistors (Double diffused MOSFETs) (also referred to herein as DMOSFETs) are a type of MOSFET that use diffusion to form the transistor regions. A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor.

One particular type of DMOS transistor is a "trench DMOS transistor" in which the channel is formed vertically and the gate is formed in a trench extending between the source and drain. The trench, which is lined with a thin oxide layer and filled with polysilicon, allows less constricted current flow and thereby provides lower values of specific on-resistance (forward-biased voltage drop). Examples of trench DMOS transistors are disclosed in U.S. Pat. Nos. 5,072,266, 5,541,425, and 5,866,931.

FIGS. 2a–2C illustrate one embodiment of a conventional trench DMOS structure 120 in which the individual cells 121 are rectangular in shape in a horizontal cross-section. It should be noted that the transistor cells 121 need not have a rectangular shape for basic transistor operation, but more generally may have any polygonal shape. However, a regular rectangular shape and a regular hexagonal shape are generally considered most convenient for layout purposes. The structure includes, in this embodiment, an N+ substrate 100 on which is grown a lightly n-doped epitaxial layer 104. Within doped epitaxial layer 104, a body region 116 of opposite conductivity is provided. An n-doped epitaxial layer 140 that overlies much of the body region 116 serves as the source. A rectangularly shaped trench 124 is provided in the epitaxial layers, which is open at the upper surface of the structure and defines the perimeter of the transistor cell. A gate oxide layer 130 lines the bottom and sidewalls of the trench 124. The trench 124 is filled with polysilicon, i.e., polycrystalline silicon. A drain electrode is connected to the back surface of the semiconductor substrate 100, a source electrode 118 is connected to the source regions 140 and the body region 116, and a gate electrode is connected to the polysilicon that fills the trench 124. As seen in FIG. 2A, the polysilicon lining trenches 124 is continuously connected over the surface of structure 120. In addition, polysilicon contacts 129 extend beyond the surface of structure 120 to serve as interconnects. It should be noted that, rather than having a closed-cell geometry as depicted in the figures, the transistor cell may have an open or stripe geometry.

As indicated, the DMOS transistor shown in FIGS. 2A–C has its gate positioned in a vertically oriented trench. This structure is often called a trench vertical DMOS. It is "vertical" because the drain contact appears on the back or underside of the substrate and because the channel flow of current from source to drain is approximately vertical. This minimizes the higher resistance associated with bent or curved current paths or with parasitic field effect construction. The device is also doubly diffused (denoted by the prefix "D") because the source region is diffused into the epitaxial material on top of a portion of the earlier-diffused body region of opposite conductivity type. This structure uses the trench sidewall area for current control by the gate and has a substantially vertical current flow associated with it. As previously mentioned, this device is particularly appropriate for use as a power switching transistor where the current carried through a given transverse silicon area is to be maximized.

Unfortunately, power MOSFETs, including trench DMOS transistors, experience reduced switching speeds due to the long recovery time of the built-in body diode, rendering them less than ideal for high frequency applications.

This problem has been addressed in the art by combining a power MOSFET in parallel with a Schottky barrier rectifier as demonstrated in FIGS. 3A through 3F.

A portion of a prior art trench DMOS transistor is illustrated schematically in FIG. 3A. Such a transistor behaves as if having a built-in body diode $D_b$ as shown in FIG. 3A. When provided within a circuit, the transistor shown in FIG. 3A can be illustrated as the portion of FIG. 3B surrounded by the dashed lines. The built-in body diode is represented by $D_2$ in FIG. 3B, which also contains switch $S_2$ associated with the transistor. Also shown in the circuit of FIG. 3B are switch $S_1$ and diode $D_1$, as well as inductor $L_1$, capacitor $C_1$ and load $R_1$. A voltage $V_{in}$ is applied across the circuit as shown.

FIG. 3C illustrates two control signals, a first gate drive signal $GDS_1$ for driving switch $S_1$ and a second gate drive signal $GDS_2$ for driving switch $S_2$, at times $T_1$, $T_2$, $T_3$, $T_4$, and $T_5$. As illustrated in FIG. 3B, at time $T_1$, signals $GDS_1$ and $GDS_2$ are such that switch $S_1$ is in the on state and switch $S_2$ is in the off state. As a result, current flows from $V_{in}$ through the top switch $S_1$, through inductor $L_1$ and through load $R_1$ to ground, as shown by the arrows in FIG. 3B.

Turning to FIG. 3D, at time $T_2$, signals $GDS_1$ and $GDS_2$ are such that both switches $S_1$ and $S_2$ are in the off state. Accordingly, current (as shown by arrows in FIG. 3D) flows through inductor $L_1$, through load $R_1$ and through built-in body diode $D_2$.

Then, as seen in FIG. 3E, at time $T_3$, signals $GDS_1$ and $GDS_2$ are such that switch $S_1$ is in the off state and switch $S_2$ is in the on state. As a result, current (as shown by arrows) flows through inductor $L_1$, through load $R_1$ and through switch $S_2$.

At time $T_4$, signals $GDS_1$ and $GDS_2$ are such that switches $S_1$ and $S_2$ are in the off state, producing a current flow like that shown in FIG. 3D. In particular, current flows through inductor $L_1$, through load $R_1$ and through built-in body diode $D_2$.

Subsequently, at time $T_5$ (and up through $T_6$), signals $GDS_1$ and $GDS_2$ are such that switch $S_1$ is in the on state and switch $S_2$ is in the off state. At this point, the current flow is as shown in FIG. 3B. Specifically, current flows from $V_{in}$ through the top switch $S_1$, through inductor $L_1$ and through load $R_1$ to ground, as shown by the arrows in FIG. 3B.

It is noted that, if both switch $S_1$ and switch $S_2$ are in the on state simultaneously, then a large current will flow from $V_{in}$, through switches $S_1$ and $S_2$, and to ground. In order to avoid this outcome, and as an example, switch $S_1$ is turned off for a brief period before switch $S_2$ is turned on (see, for example, the time period between $T_2$ and $T_3$). During this time period, however, current will pass through the built-in diode $D_2$ as discussed above. For a typical trench DMOS transistor, this current results in a voltage drop across the built-in body diode $D_2$ that is about 0.65V. However, by adding a Schottky diode $D_S$ as shown in FIG. 3F, this voltage drop can be reduced to about 0.3V, reducing power dissipation.

Moreover, during the time from $T_4$ to $T_5$, current passes through the built-in body diode $D_2$. At $T_5$, however, the top switch $S_1$ is turned on, and a current passes through the body diode $D_2$ to ground for a certain period of time, due to the long reverse recovery time of the body diode $D_2$. Schottky diodes, on the other hand, have a relatively short reverse recovery time. Hence, if a Schottky diode is provided as shown in FIG. 3F above, much less current will pass to ground, due to this shorter reverse recovery time.

Hence, this arrangement results in a high efficiency system, particularly for high frequency systems requiring low power consumption, such as portable systems. Examples of such systems can be found in U.S. Pat. No. 5,915,179 entitled "Semiconductor Device and Method of Manufacturing the Same" and U.S. Pat. No. 4,811,065 entitled "Power DMOS Transistor with High Speed Body Diode". In U.S. Pat. No. 4,811,065, a Schottky barrier rectifier is combined with a vertical DMOS transistor, within a semiconductor structure, to form a device equivalent to a Schottky barrier rectifier in parallel with an N channel vertical DMOS transistor.

Unfortunately, MOS trench Schottky barrier rectifiers like those disclosed in U.S. Pat. No. 5,365,102, are disadvantageous for integration with a trench DMOS transistors, because the MOS trench of the Schottky barrier rectifier is filled with metal, potentially resulting in a metal coverage problem in the trench area. At present, this difficulty is overcome by integrating trench DMOS transistors and MOS trench Schottky barrier rectifiers together in one package using the MCM (multiple chips module) method, significantly adding to the expense of such devices.

SUMMARY OF THE INVENTION

Hence, there is a need in the art to integrate a MOS trench Schottky barrier rectifier with a trench DMOS transistor on a single substrate, without encountering metal coverage problems in the trench area. The present invention meets this need by providing a Schottky barrier rectifier with a polysilicon oxide semiconductor trench, rather than the prior art MOS (metal oxide semiconductor) trench and integrating the same with a trench DMOS transistor on a single substrate.

More particularly, according to an embodiment of the invention, an integrated circuit is provided that has a plurality of trench Schottky barrier rectifiers within one or more rectifier regions and a plurality of trench DMOS transistors within one or more transistor regions. The integrated circuit comprises: (a) a substrate of a first conductivity type; (b) an epitaxial layer of the first conductivity type over the substrate, wherein the epitaxial layer has a lower doping level than the substrate; (c) a plurality of body regions of a second conductivity type within the epitaxial layer in the transistor regions; (d) a plurality of trenches within the epitaxial layer in both the transistor regions and the rectifier regions; (e) a first insulating layer that lines the trenches; (f) a polysilicon conductor within the trenches and overlying the first insulating layer; (g) a plurality of source regions of the first conductivity type within the body regions at a location adjacent to the trenches; (h) a second insulating layer over the doped polysilicon layer in the transistor regions; and (i) an electrode layer over both the transistor regions and the rectifier regions.

An electrode layer is also preferably provided on a surface of the substrate opposing the body regions.

Preferably, the substrate is an n-doped substrate, the first insulating layer is a silicon dioxide layer, and the second insulating layer is a borophosphosilicate glass layer.

According to another embodiment of the invention, an integrated circuit is provided which comprises: (a) a plurality of trench Schottky barrier rectifiers and (b) a plurality of trench DMOS transistors. In this embodiment, the trench Schottky barrier rectifiers and the trench DMOS transistors are integrated upon a common substrate, and trenches associated with the trench Schottky barrier rectifiers and the trench DMOS transistors are filled with polysilicon.

Preferably, the trench Schottky barrier rectifiers and the trench DMOS transistors are fabricated from a common oxide layer and a common polysilicon layer disposed over the oxide layer. More preferably, the trench Schottky barrier rectifiers and the trench DMOS transistors are fabricated using a common substrate, a common epitaxial layer disposed over the substrate, a common oxide layer disposed over the epitaxial layer, and a common polysilicon layer disposed over the oxide layer.

In addition, the anodes of the trench Schottky barrier rectifiers and the sources of the trench DMOS transistors preferably share a common electrode, and the cathodes of the trench Schottky barrier rectifiers and the drains of the trench DMOS transistors preferably share a common electrode.

According to an another embodiment of the present invention, a method is described for manufacturing an integrated circuit comprising a plurality of trench Schottky barrier rectifiers within one or more rectifier regions and a plurality of trench DMOS transistors within one or more transistor regions. The method comprises: (a) providing a substrate of a first conductivity type; (b) forming an epitaxial layer of the first conductivity type over the substrate, wherein the epitaxial layer has a lower doping level than the substrate; (c) forming a one or more body regions of a second conductivity type within the epitaxial layer in the transistor regions; (d) forming a plurality of trenches within the epitaxial layer in both the transistor regions and the rectifier regions; (e) forming a first insulating layer that lines the trenches; (f) forming a polysilicon conductor within the trenches and overlying the first insulating layer; (g) forming a plurality of source regions of the first conductivity type within the body regions adjacent the trenches; (h) forming a second insulating layer over the polysilicon conductor in the transistor regions; and (i) forming an electrode layer over both the transistor regions and the rectifier regions.

In addition, an electrode layer is preferably formed on the surface of the substrate opposite the body regions.

According to several preferred embodiments: (a) the step of forming the body regions includes the steps of forming a patterned masking layer over the epitaxial layer and implanting and diffusing a dopant into the epitaxial layer; (b) the step of forming the trenches includes the step of forming a patterned masking layer over the epitaxial layer and etching the trenches through the masking layer; (c) the step of forming the source regions includes the steps of forming a patterned masking layer and implanting and diffusing a dopant into the body regions; (d) the step of forming the second insulating layer over the polysilicon layer in the transistor region comprises the steps of depositing a BPSG layer over at least the transistor region, forming a patterned masking layer over the BPSG layer, and etching the BPSG layer in areas not covered by the patterned masking layer.

The present invention is advantageous in that it provides a product in which a trench Schottky barrier rectifier is integrated with a trench DMOS transistor on a single substrate and a method for making the same. As a result, such devices can be fabricated with greater ease and less expense than has heretofore been possible.

Still other embodiments and advantages will become readily apparent to those skilled in the art upon review of the Detailed Description, Examples and claims set forth below.

BRIEF DESCRIPTION OF THE DRAWINGS

FIG. 2A shows a plan view of a conventional trench DMOS transistor.

FIG. 2B shows an enlarged plan view illustrating an individual cell in the conventional transistor of FIG. 1.

FIG. 2C shows a cross-sectional view of the DMOS transistor shown in FIGs. 2A and 2B, taken along line A—A' of FIG. 2B.

DETAILED DESCRIPTION OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 1:
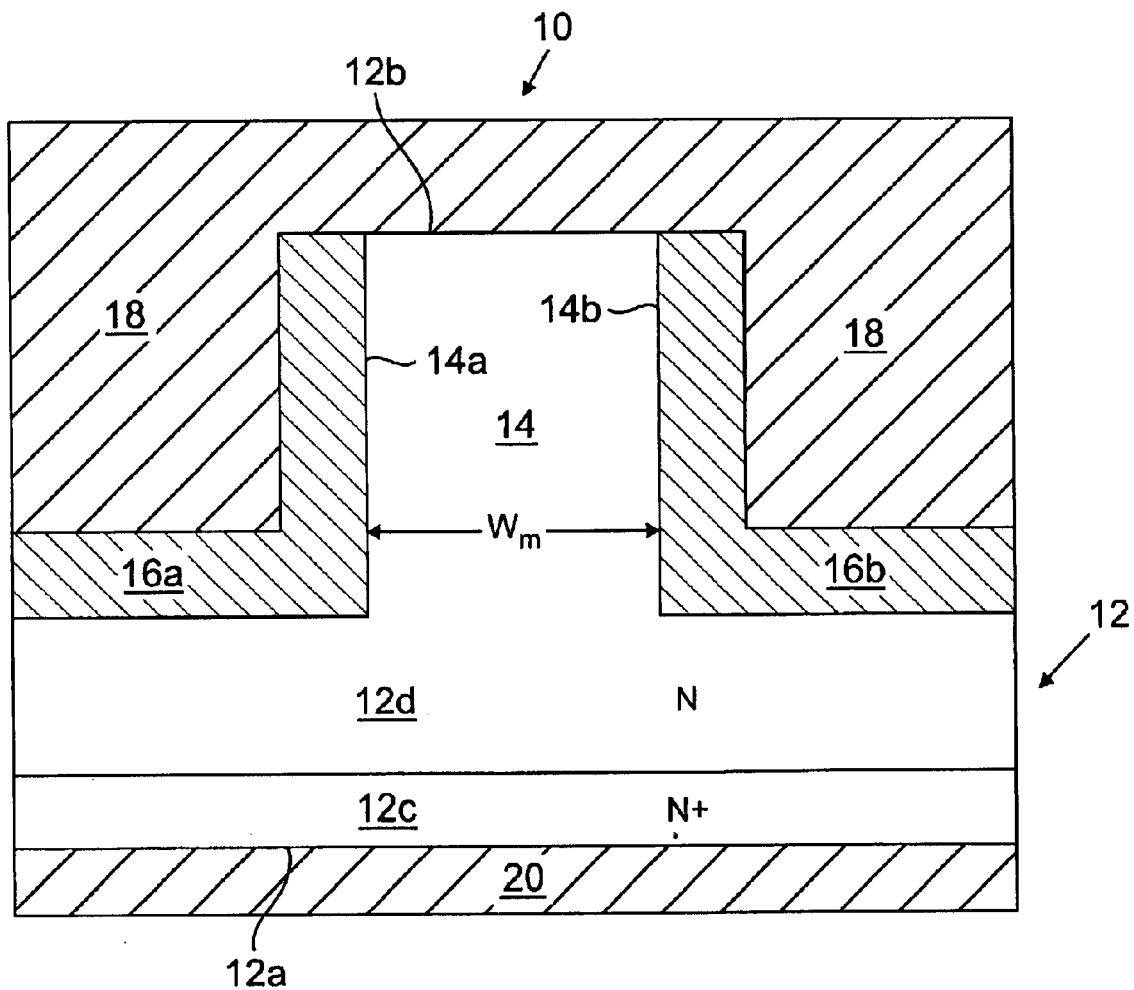
FIG. 1 shows a cross-sectional view of a MOS trench Schottky barrier rectifier of the prior art.
Figure 3A:
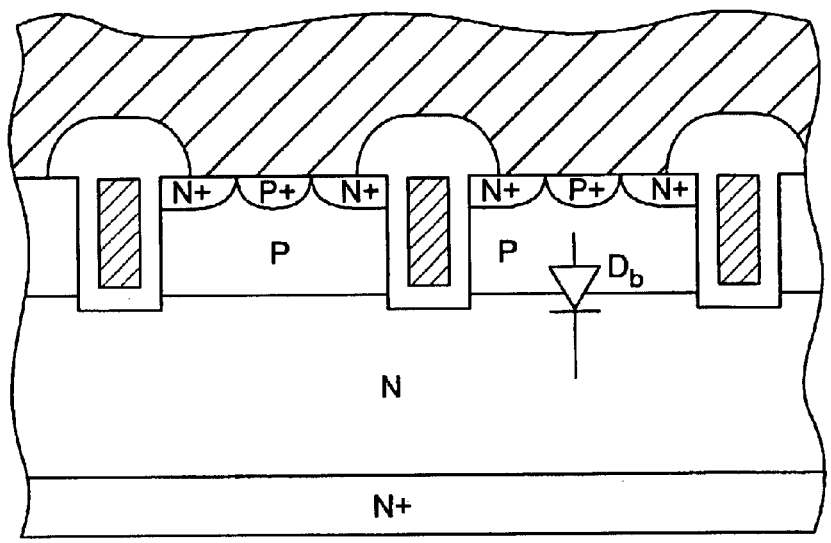
FIG. 3A is a schematic illustration of a portion of a prior art trench DMOS transistor, which behaves as if possessing a built-in body diode $D_b$.
Figure 3B:
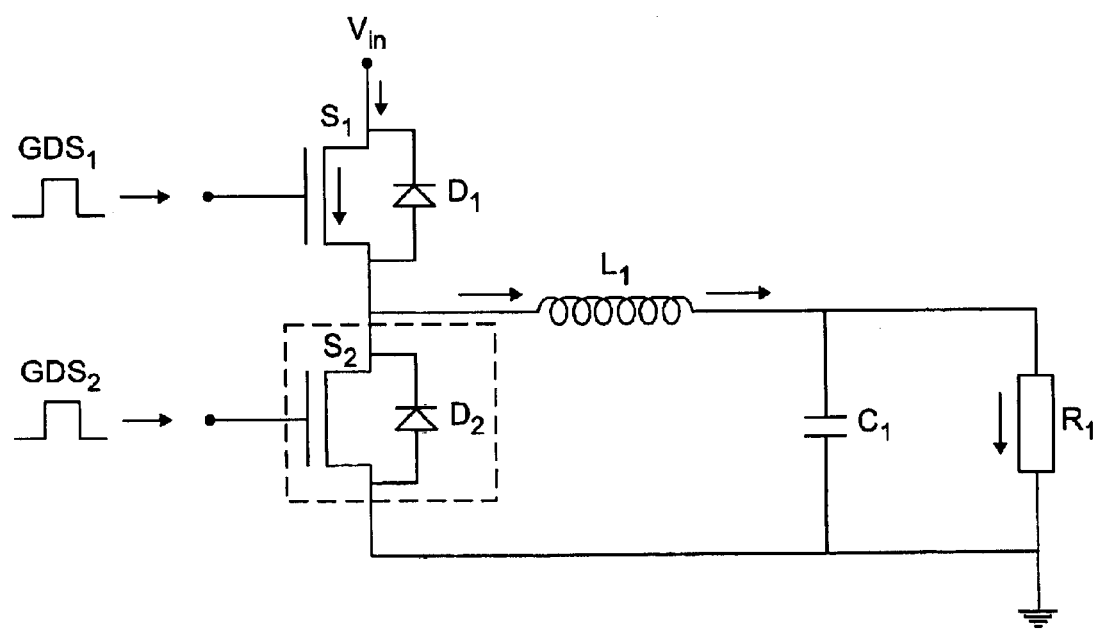
FIG. 3B is a circuit diagram, which includes an equivalent circuit for the structure of FIG. 3A. Current flow is shown for the case where switch $S_1$ is in the on state and switch $S_2$ is in the off state.
Figure 3C:
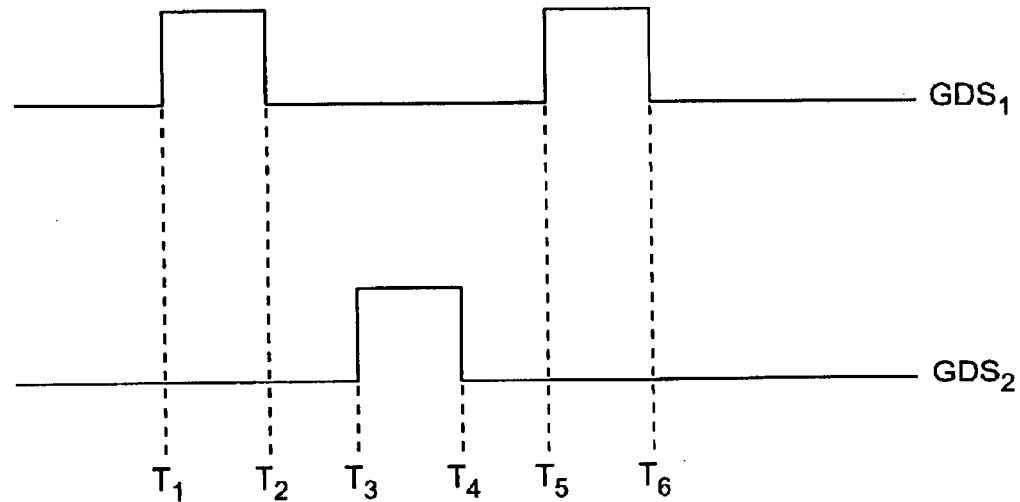
FIG. 3C illustrates two control signals for driving switches $S_1$ and $S_2$ (shown in FIG. 3B) at times $T_1$, $T_2$, $T_3$, $T_4$, and $T_5$.
Figure 3D:
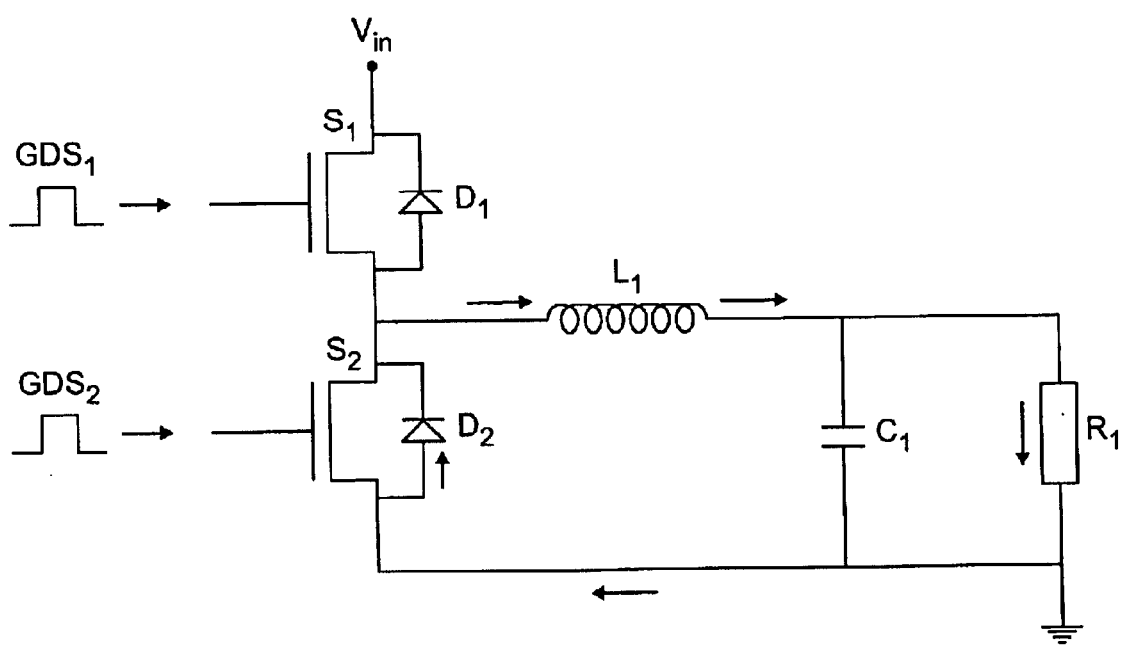
FIG. 3D illustrates current flow for the circuit of FIG. 3B where switches $S_1$ and $S_2$ are in the off state.
Figure 3E:
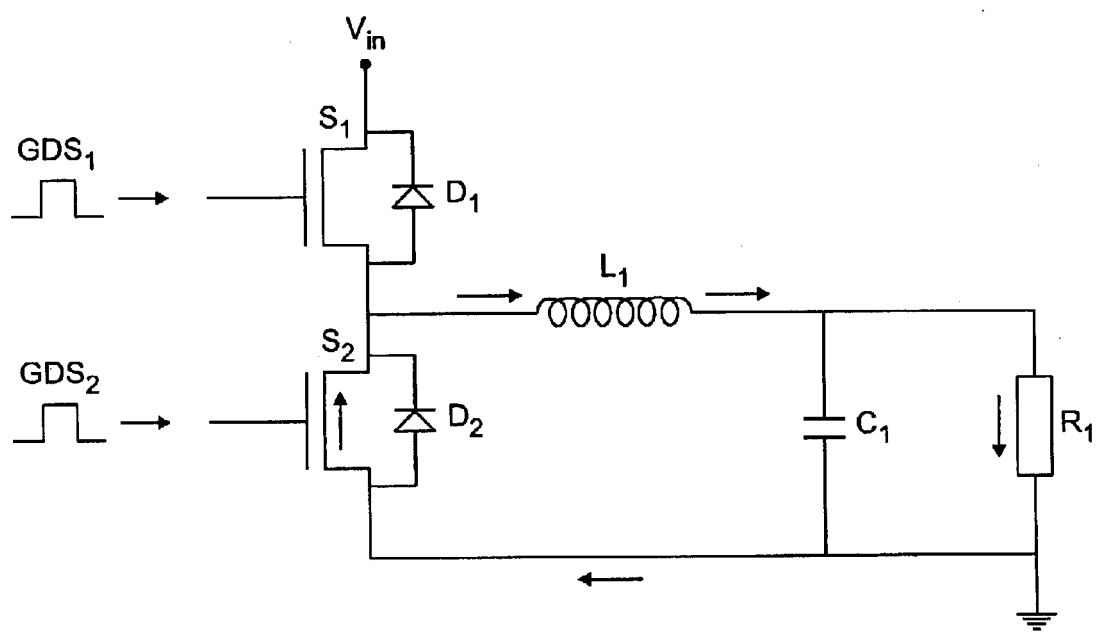
FIG. 3E illustrates current flow for the circuit of FIG. 3B where switch $S_1$ is in the off state and switch $S_2$ is in the on state.
Figure 3F:
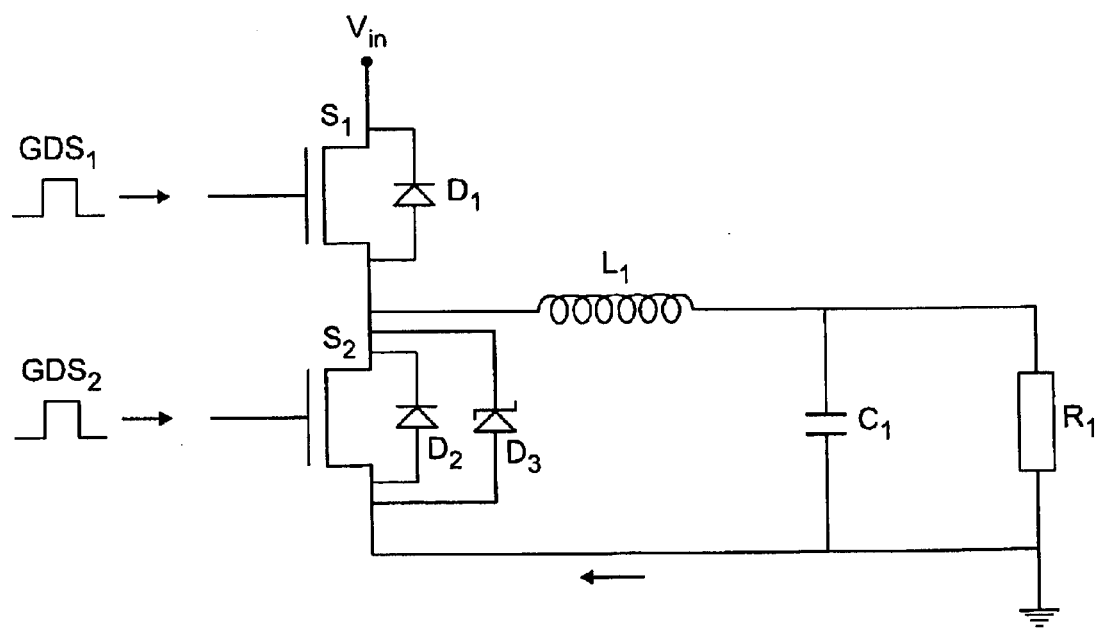
FIG. 3F is the circuit diagram of FIG. 3B after the addition of a Schottky barrier diode.
Figure 4:
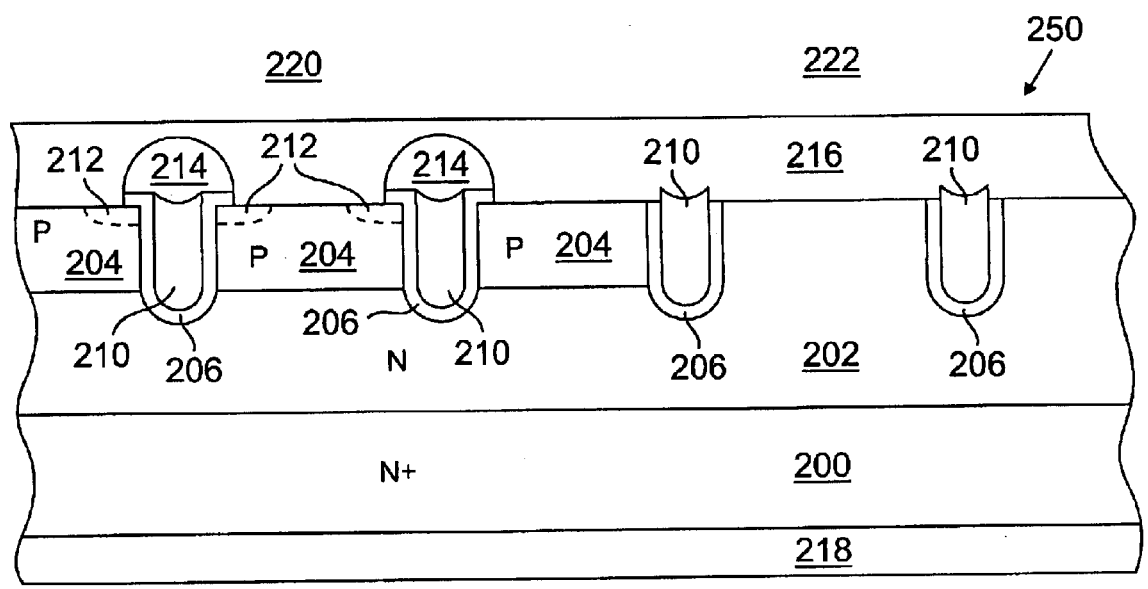
FIG. 4 shows a cross sectional view of an embodiment of a combination trench DMOS transistor and trench Schottky barrier rectifier of the present invention.

FIG. 4 illustrates one embodiment of the present invention, showing a combination trench DMOS transistor and trench Schottky barrier rectifier structure 250. Structure 250 has DMOS transistor devices within DMOS transistor region 220 and has Schottky barrier rectifier devices within rectifier region 222. Structure 250 includes, within this embodiment, an N+ substrate 200 on which is grown a lightly n-doped epitaxial layer 202, which serves as the drain for the DMOS transistor devices and cathode/drift region for the rectifier devices. Conductive layer 218 acts as a common drain contact for the DMOS transistor devices and as a common cathode electrode from the rectifier devices.

Within portions of doped N epitaxial layer 202, P body regions 204 of opposite conductivity act as the gate region for the DMOS transistor devices. N+ regions 212 are also provided, which act as sources for the DMOS transistor devices.

Conductive layer 216 acts as a common source contact for the DMOS transistor devices, shorting sources (i.e., N+ regions 212) with one another. Conductive layer 216 acts as anode electrode for the rectifier devices.

Trench regions lined with oxide layers 206 and filled with polysilicon 210 are provided. Within the rectifier devices, these trench regions create a mesa structure, resulting in increased reverse-blocking voltage, among other effects. It is noted that polysilicon 210 is shorted to the conductive layer 216 (anode) for the rectifier devices.

The filled trenches 206, 210 act as gate electrodes for the trench DMOS transistor devices. In contrast to the rectifier devices, polysilicon 210 is insulated from conductive layer 216 (source contact) by BPSG (borophosphosilicate glass) structures 214, allowing the gates and sources to be independently biased.

FIGS. 5A to 5J show the steps that are preformed to form the trench DMOS transistor with embedded trench Schottky rectifier 250 depicted in FIG. 4.

Figure 5A:
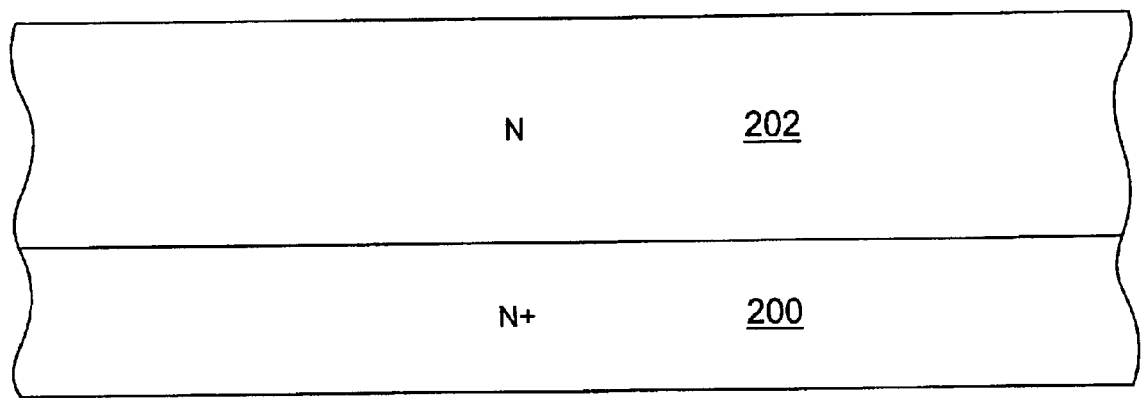
FIGS. 5A to 5J are sectional views illustrating a method of manufacturing a combination trench DMOS transistor and trench Schottky barrier rectifier according to an embodiment of the invention.

Referring to FIG. 5A, an N-doped epitaxial layer 202 is grown on a conventionally N+ doped substrate 200. Epitaxial layer is typically 5.5 microns in thickness for a 30 V trench DMOS transistor device.

Figure 5B:
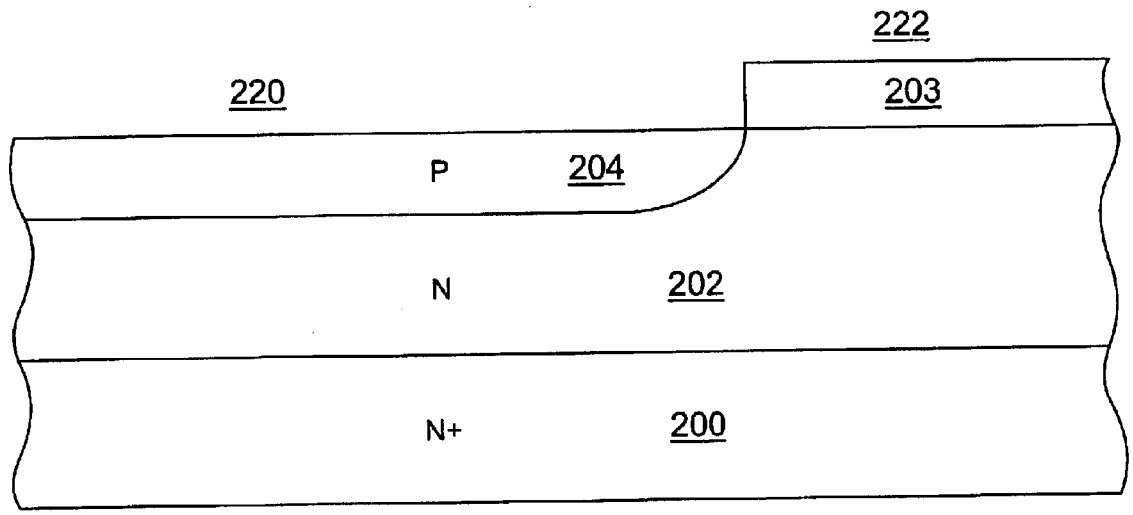

Next, a photoresist masking process is used to form a patterned masking layer 203. Patterned masking layer 203 defines P-body region 204 which is formed by implantation and diffusion processes as shown in FIG. 5B. For example, the P-body region may be implanted at 40 to 60 keV with a dosage of $5.5 \times 10^{13}/cm^3$. P-body region 204 defines a DMOS transistor region 220 of the device. A rectifier region 222 of the structure 250 is not provided with such a P-body region.

Figure 5C:
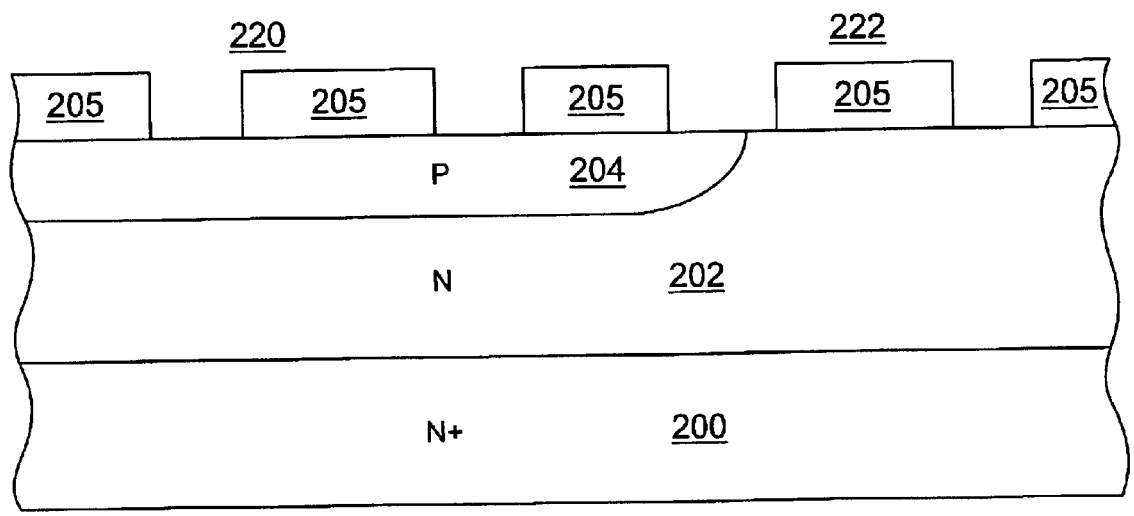
Figure 5D:
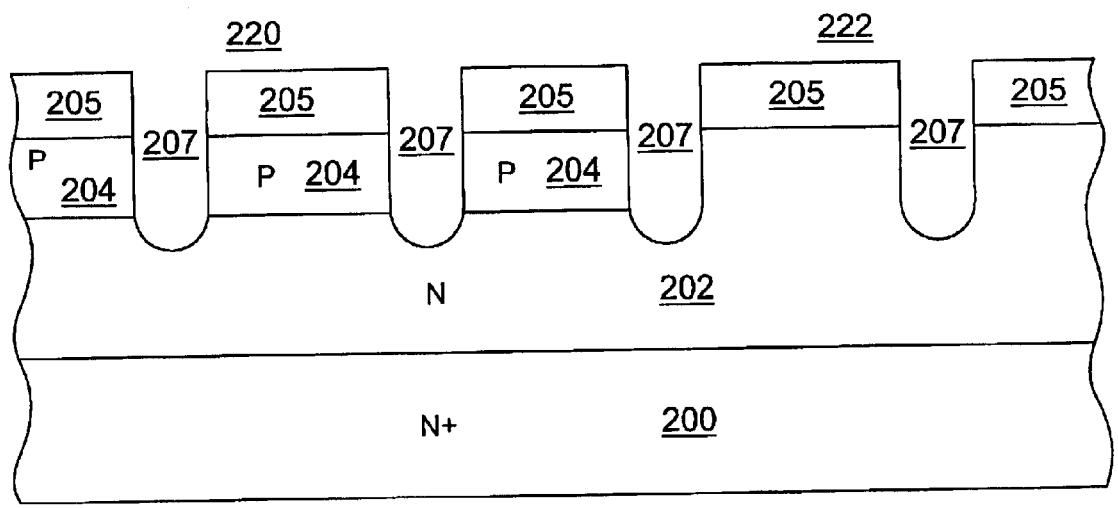

Patterned masking layer 203 is then removed by any appropriate method known in the art. Mask portions 205 are then provided as shown in FIG. 5C. Mask portions define the location of trenches 207 as shown in FIG. 5D. Trenches are preferably dry etched through openings between mask portions 205 by reactive ion etching, typically to a depth that ranges from 1.5 to 2.5 microns.

Figure 5E:
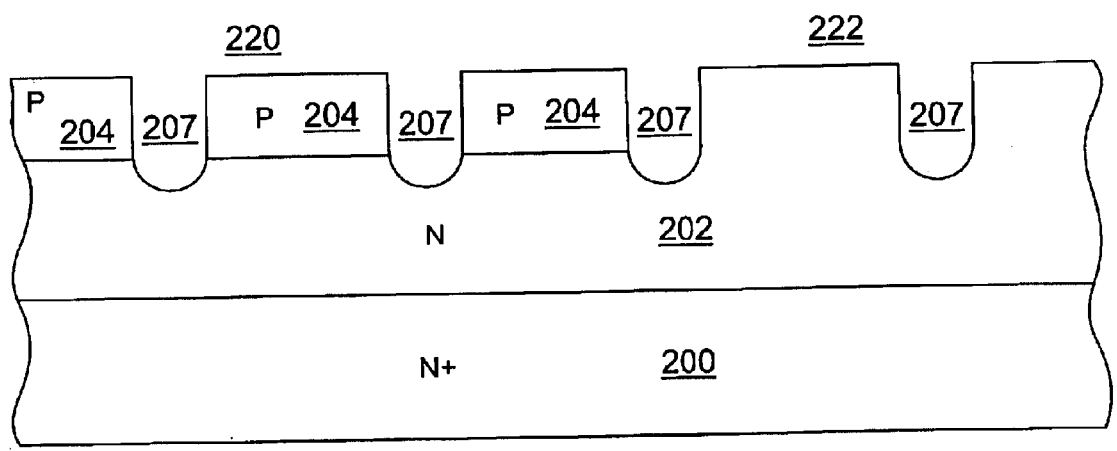
Figure 5F:
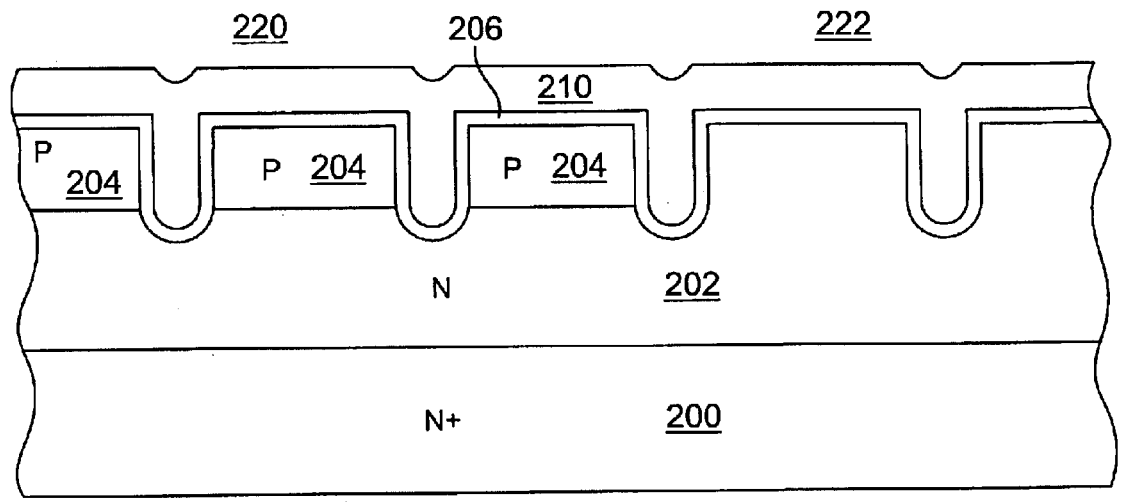

Mask portions 205 are then removed as shown in FIG. 5E, and oxide layer 206 is formed over the surface of the entire structure, typically by thermal oxidation. Oxide thicknesses in the range of 500 to 800 Angstroms are typical for layer 206. Subsequently, the surface is covered (and the trenches are filled) with polysilicon 210, i.e., polycrystalline silicon, using techniques known in the art, such as CVD, to provide the structure shown in FIG. 5F. Polysilicon 210 is typically doped to reduce its resistivity, typically on order of 20 Ω/m. Doping can be carried out, for example, during CVD with phosphorous chloride or by implantation with arsenic or phosphorous.

Figure 5G:
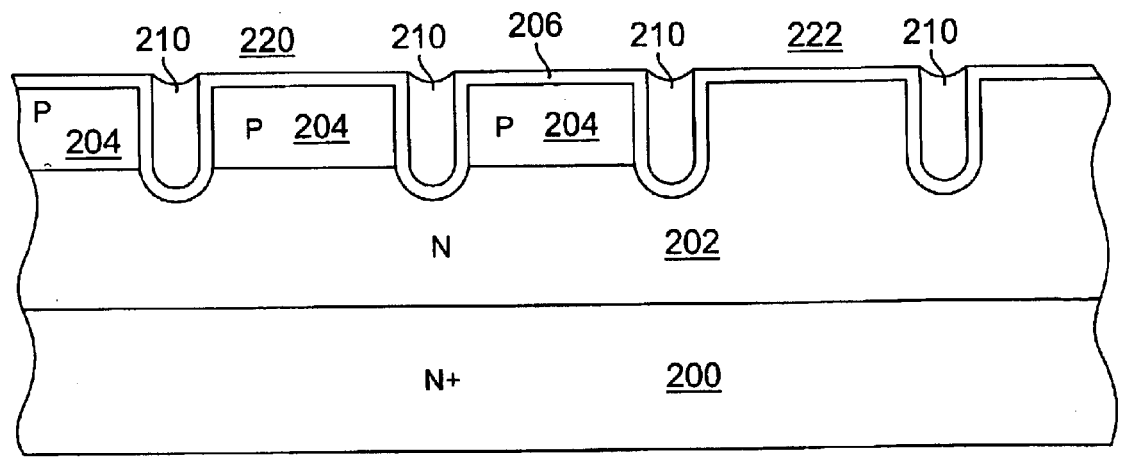

Polysilicon 210 is then etched, for example, by reactive ion etching (RIE), to optimize its thickness within the trenches and to expose portions of oxide layer 206 as shown in FIG. 5G.

Figure 5H:
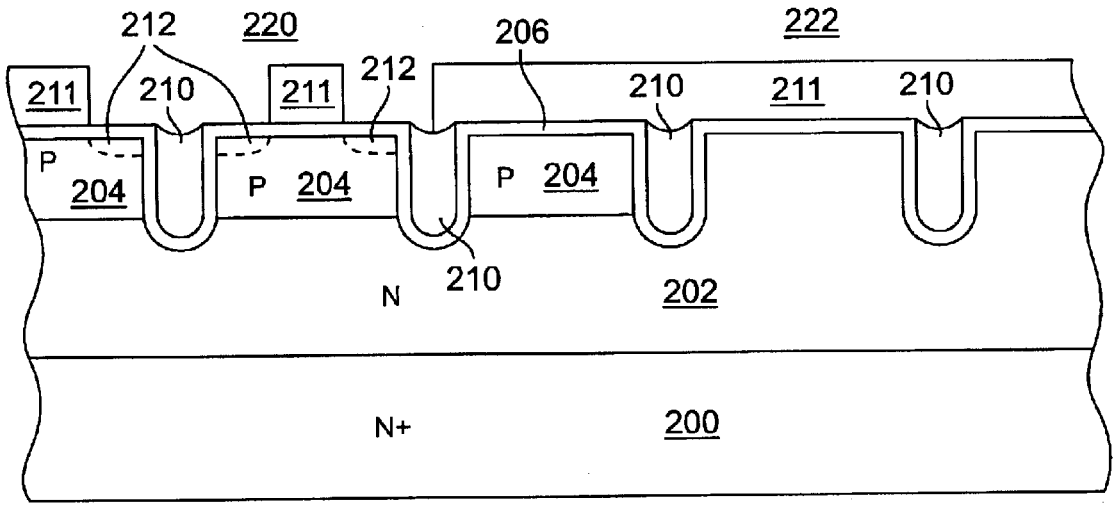

Next, a photoresist masking process is used to form patterned masking layer 211 as shown in FIG. 5H. Patterned masking layer 211 defines source regions 212 within DMOS transistor region 220. Source regions 212 are typically formed via an implantation and diffusion process. For example, the source regions 212 may be implanted with arsenic at 80 keV to a concentration that is frequently in the range of $8 \times 10^{15}$ to $1.2 \times 10^{16}$ cm$^{-3}$. After implantation, the arsenic is diffused to a depth of approximately 0.5 microns.

Figure 5I:
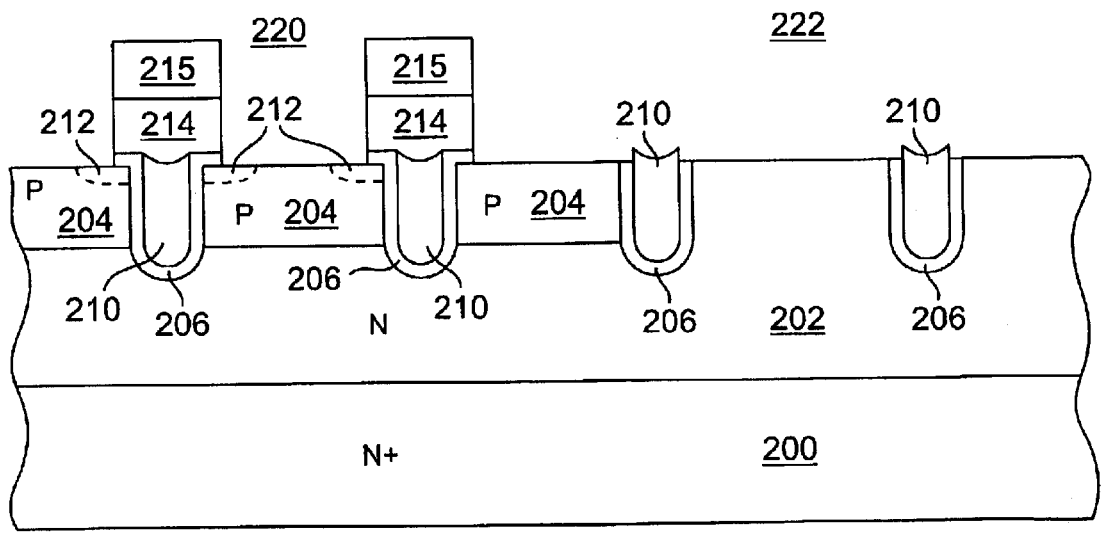

Patterned masking layer 211 is then removed by any appropriate technique known in the art. Subsequently, BPSG (borophosphosilicate glass) layer 214 is then formed over the entire structure, for example, by PECVD, and provided with patterned photoresist layer 215. The structure is then etched, typically by RIE, to remove BPSG layer 214 and oxide layer 206 in those areas not covered by photoresist layer 215 as shown in FIG. 5I.

Figure 5J:
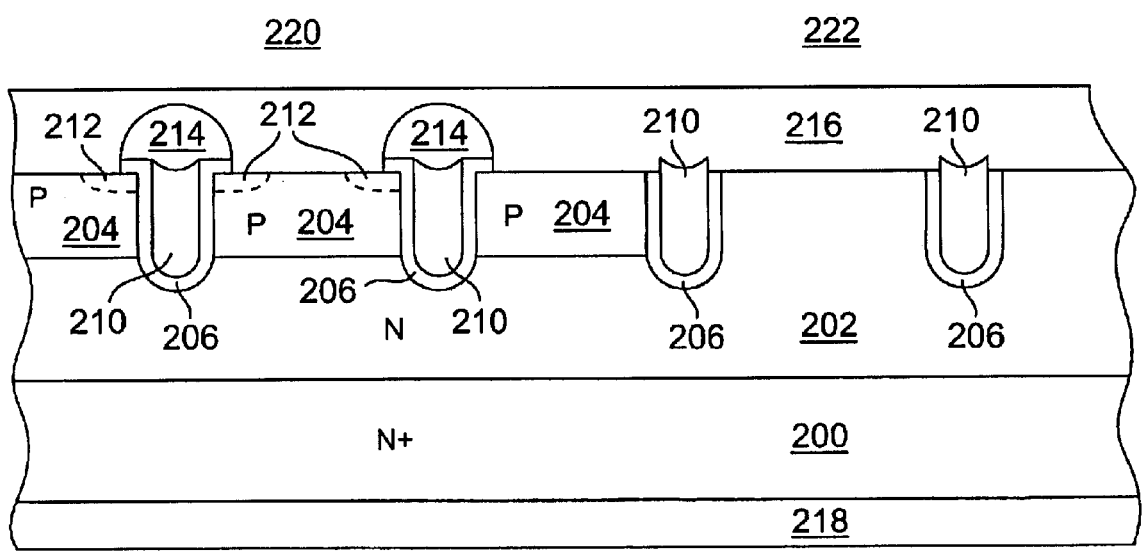

Photoresist layer 215 is removed, typically by RIE, followed by BPSG reflow and a post-reflow etching step as is known in the art. Finally, the structure is then provided with metal contact layer 216 as shown in FIG. 5J by a metal sputtering step. Metal contact layer 218 is also provided as shown to complete the device.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A method of manufacturing an integrated circuit comprising a plurality of trench Schottky barrier rectifiers within one or more rectifier regions and a plurality of trench DMOS transistors within one or more transistor regions, a uniform common electrode layer acting as a common source for the DMOS transistors and acting as an anode electrode for the rectifiers, said method comprising:

providing a substrate of a first conductivity type;

forming an epitaxial layer of said first conductivity type over said substrate, said epitaxial layer having a lower doping level than said substrate;

forming a one or more body regions of a second conductivity type within said epitaxial layer in said transistor regions;

forming a plurality of trenches within said epitaxial layer in both said transistor regions and said rectifier regions;

forming a first insulating layer that lines said trenches;

forming a polysilicon conductor within said trenches and overlying the first insulting layer;

forming a plurality of source regions of said first conductivity type within said body regions adjacent to said trenches;

forming a second insulating layer over said polysilicon conductor within said transistor regions; and forming a uniform common electrode layer that is continuous over said transistor regions and said rectifier regions.

2. The method of claim 1 wherein the step of forming the body regions includes the steps of forming a patterned masking layer over the epitaxial layer and implanting and diffusing a dopant into the epitaxial layer.

3. The method of claim 1 wherein the step of forming the trenches includes the step of forming a patterned masking layer over the epitaxial layer and etching said trenches through said masking layer.

4. The method of claim 1 wherein the step of forming the source regions includes the steps of forming a patterned masking layer and implanting and diffusing a dopant into the body regions.

5. The method of claim 1 wherein the step of forming the second insulating layer over the polysilicon layer in said transistor region comprises the steps of depositing a BPSG layer over at least the transistor region, forming a patterned masking layer over said BPSG layer, and etching said BPSG layer in areas not covered by the patterned masking layer.

6. The method of claim 1 further comprising forming an electrode layer on a surface of the substrate opposite the body regions.

* * * * *

UNITED STATES PATENT AND TRADEMARK OFFICE
CERTIFICATE OF CORRECTION

PATENT NO. : 6,762,098 B2
APPLICATION NO. : 10/448791
DATED : July 13, 2004
INVENTOR(S) : Fwu-Iuan Hshieh et al.

Page 1 of 1

It is certified that error appears in the above-identified patent and that said Letters Patent is hereby corrected as shown below:

Col. 1, Line 9, after "2000", insert -- , --.

Col. 4, Line 15, before "trench", delete "a".

Col. 5, Line 17, before "another", delete "an".

Col. 5, Line 25, before "one", delete "a".

Col. 5, Line 63, change "claims" to -- Claims --.

Col. 8, Line 28, before "one", delete "a".

Col. 8, Line 35, after "first", change "insulting" to -- insulating --.

Signed and Sealed this

Twenty-first Day of August, 2007

JON W. DUDAS
*Director of the United States Patent and Trademark Office*